(12) United States Patent
Inazuki et al.

(10) Patent No.: US 8,417,018 B2
(45) Date of Patent: Apr. 9, 2013

(54) METHOD FOR INSPECTING AND JUDGING PHOTOMASK BLANK OR INTERMEDIATE THEREOF

(75) Inventors: Yukio Inazuki, Joetsu (JP); Hideo Kaneko, Joetsu (JP); Hiroki Yoshikawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 385 days.

(21) Appl. No.: 12/750,023

(22) Filed: Mar. 30, 2010

(65) Prior Publication Data

US 2010/0246932 A1    Sep. 30, 2010

(30) Foreign Application Priority Data

Mar. 31, 2009 (JP) .................................. 2009-086173

(51) Int. Cl.
*G06K 9/00* (2006.01)

(52) U.S. Cl. ..................... 382/144; 356/401; 356/237.1; 356/237.6

(58) Field of Classification Search .................. 382/144; 356/237.1–237.6
See application file for complete search history.

(56) References Cited

U.S. PATENT DOCUMENTS

| | | | |
|---|---|---|---|
| 5,830,607 A | 11/1998 | Isao et al. | |
| 7,195,846 B2 | 3/2007 | Kaneko et al. | |
| 2004/0191646 A1* | 9/2004 | Yoshikawa et al. | 430/5 |
| 2004/0253524 A1 | 12/2004 | Itoh | |
| 2005/0019678 A1* | 1/2005 | Nakatsu et al. | 430/5 |
| 2007/0212618 A1 | 9/2007 | Yoshikawa et al. | |
| 2007/0212619 A1* | 9/2007 | Yoshikawa et al. | 430/5 |
| 2009/0035880 A1 | 2/2009 | Itoh | |

FOREIGN PATENT DOCUMENTS

| | | |
|---|---|---|
| EP | 1 832 926 A2 | 9/2007 |
| JP | 63-85553 A | 4/1988 |
| JP | 7-140635 A | 6/1995 |
| JP | 2003-50458 A | 2/2003 |
| JP | 2004-199035 A | 7/2004 |
| JP | 2004-361432 A | 12/2004 |
| JP | 2006-195200 A | 7/2006 |
| JP | 2006-195202 A | 7/2006 |
| JP | 2007-241060 A | 9/2007 |
| JP | 2007-241065 A | 9/2007 |

OTHER PUBLICATIONS

Borodovsky et al., "Matching to the beat of Moore's Law", Proceedings of SPIE, vol. 6153, pp. 615301-1 to 19, (2006).
Extended European Search Report for European Application No. 10250686.2 mailed Jul. 15, 2011.

* cited by examiner

*Primary Examiner* — Tarifur Chowdhury
*Assistant Examiner* — Isiaka Akanbi
(74) *Attorney, Agent, or Firm* — Birch, Stewart, Kolasch & Birch, LLP

(57) ABSTRACT

A photomask blank having a film on a substrate is inspected by (A) measuring a surface topography of a photomask blank having a film to be inspected for stress, (B) removing the film from the photomask blank to provide a treated substrate, (C) measuring a surface topography of the treated substrate, and (D) comparing the surface topography of the photomask blank with the surface topography of the treated substrate, thereby evaluating a stress in the film.

14 Claims, 1 Drawing Sheet

METHOD FOR INSPECTING AND JUDGING PHOTOMASK BLANK OR INTERMEDIATE THEREOF

CROSS-REFERENCE TO RELATED APPLICATION

This non-provisional application claims priority under 35U.S.C. §119(a) on Patent Application No. 2009-086173 filed in Japan on Mar. 31, 2009, the entire contents of which are hereby incorporated by reference.

TECHNICAL FIELD

This invention relates to a method for inspecting and judging photomask blanks or intermediates thereof from which are produced photomasks for use in the lithographic manufacture of semiconductor integrated circuits, charge-coupled devices (CDD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, the manufacture of circuit pattern-written photomasks for use in the photolithography for forming such wiring patterns and contact hole patterns needs a technique capable of accurately writing finer circuit patterns in order to meet the miniaturization demand.

In forming a finer feature pattern, a resist film is exposed to a pattern of radiation using a photomask and an optical system. If the photomask undergoes any shape change at this point, the positional accuracy of the resultant image is reduced, resulting in defective patterns. To overcome the problem, the shape of a photomask substrate must be controlled as reported in JP-A 2003-50458. It is reported that use of a substrate having a specific surface topography as the photomask substrate suppresses any change of surface topography when the photomask is chucked to the mask stage of the exposure tool.

In the prior art, the flatness of photomask-forming transparent substrates and photomask blanks is regarded important. When an optical film such as a light-shielding film or phase shift film is deposited on a photomask-forming transparent substrate, the stress in the optical film is controlled so that the substrate shape may not be changed. Many techniques for controlling "sori" (warpage or bow), that is, shape change of the substrate surface are known, as described in JP-A 2004-199035.

Aside from the problem of substrate shape, the size control of a pattern of optical film such as a semiconductor circuitry pattern written on a photomask is also a problem. A higher degree of control is required as the desired pattern feature size is reduced. For example, in the manufacture of a photomask for use in producing a pattern having the minimum line width of up to 65 nm, especially up to 50 nm, a light-shielding film of chromium base material used in the prior art is difficult to control side etching during the etching step. Then the finish size may widely vary with a different density of a pattern to be written, known as the pattern density dependency or "proximity bias". JP-A 2007-241060 describes that the problem of proximity bias can be mitigated by forming the light-shielding film from an optionally transition metal-containing silicon base material and that the light-shielding film is processed using a very thin chromium base material as an etching mask. It is described that using an optionally transition metal-containing silicon base material as the etching mask, a photomask which is size controlled at a very high accuracy can be manufactured.

The photomask for use in the lithography wherein a semiconductor circuit pattern has a minimum size of up to 45 nm requires a high degree of size control. When such a photomask is prepared using an optionally transition metal-containing silicon base material as the light-shielding film and a chromium base material as the etching mask film, the size control has little latitude.

In the manufacture of photomasks used in the lithography for forming a pattern having a minimum size of up to 45 nm, especially the lithography of which a higher accuracy of positional control is required as in the case of double patterning (Proceedings of SPIE, Vol. 6153, 615301-1 to 19 (2006)), the yield of photomask manufacture cannot be increased unless a reliability surpassing the currently available accuracy is provided.

| Citation List | |
|---|---|
| Patent Document 1: | JP-A 2003-050458 |
| Patent Document 2: | JP-A 2004-199035 |
| Patent Document 3: | JP-A 2007-241060 |
| | (US 2007/212619, EP 1832926A2) |
| Patent Document 4: | JP-A H07-140635 |
| Patent Document 5: | JP-A 2007-241065 |
| Patent Document 6: | JP-A S63-085553 |
| Non-Patent Document 1: | Proceedings of SPIE, Vol. 6153, 615301-1 to 19 (2006) |

SUMMARY OF INVENTION

An object of the invention is to provide a method for inspecting and judging a photomask blank or intermediate thereof having an optical functional film such as a light-shielding film or phase shift film and requiring a high accuracy of processing, to insure that any change of surface topography which can cause dimensional errors upon processing does not occur.

As discussed above, an appropriate shape control method is necessary for a photomask or photomask blank so that the photomask may not incur a degraded depth of focus on use. It has been a practice to use a less stressed film as the optical film such as a light-shielding film or phase shift film to avoid that the photomask-forming substrate undergoes a shape change before and after deposition of the optical film so that the photomask becomes unusable (see, for example, JP-A 2004-199035).

The inventors made extensive investigations on the change of surface topography during processing of a photomask blank into a photomask which can cause an error in pattern position to the photomask. A light-shielding film which provides a surface topography highly conformal to the surface topography of a substrate prior to deposition of the light-shielding film, that is, a light-shielding film which is considered as substantially free of stress in the prior art is deposited to form a photomask blank. When the light-shielding film of the photomask blank is etched, the surface topography can be deformed despite the substantially reduced stress of the light-shielding film. That is, a lowering of position accuracy is concomitant with the processing.

To improve the reliability with respect to the position and dimension of a photomask which is fabricated from a photomask blank, the pattern of a light-shielding section on the finished photomask must be formed at a position spaced least apart from the position at which the resist pattern for forming the pattern of a light-shielding section is formed. As used herein, the term "position" is not the relative position on the surface of the photomask blank, but the position as viewed in a spatial coordinate system having the origin positioned at the center of the photomask blank major surface and a XY plane juxtaposed to a least square plane of the major surface. If the surface topography changes during etching, then a position shift occurs.

Then the inventors presumed that the following inspection is necessary in order to produce a photomask blank with higher reliability. That is, the shape of the outermost surface of a photomask blank or an intermediate (or precursor) for the manufacture of a photomask blank must be compared before and after stripping of an optical functional film such as a light-shielding film.

For example, in the case of a binary mask blank having only a light-shielding film from which a photomask having a bright pattern is produced, inspection is performed by the following method.

(1) A plurality of photomask blanks are manufactured by depositing a light-shielding film on a photomask-forming substrate (transparent substrate) under given conditions.
(2) From the plurality of photomask blanks, at least one is taken out as a sample.
(3) The surface topography of the sample is measured.
(4) The light-shielding film is removed so that the treated substrate presents the outermost surface.
(5) The surface topography of the treated substrate is measured.
(6) The surface topography data of step (3) is compared with the surface topography data of step (5). The sample whose change is below the prescribed level is judged pass (i.e., acceptable).

Once a photomask blank or intermediate is inspected by the above method, inverse reflection becomes possible, depending on the desired accuracy. That is, based on the inspection results, the manufacture characteristics imparted to a photomask blank by the deposition of an optical functional film can be reflected in the manufacture of a photomask blank or intermediate. Also, since the surface topography is judged on a pass/fail basis in a manner following actual processing, a plurality of photomasks produced under the identical conditions are given the guarantee that the change of surface topography during processing is insignificant, with a high reliability. The present invention is predicated on this finding.

The invention provides a method for inspecting a photomask blank or an intermediate thereof and a method for judging a photomask blank or an intermediate thereof on a pass/fail basis, as defined below.

[1] A method for inspecting a photomask blank or an intermediate thereof having a film on a substrate, comprising the steps of:
  (A) measuring a surface topography of a photomask blank or intermediate having a film to be inspected for stress,
  (B) removing the film from the photomask blank or intermediate to provide a treated substrate,
  (C) measuring a surface topography of the treated substrate after removal of the film, and
  (D) comparing the surface topography of the photomask blank or intermediate prior to film removal with the surface topography of the treated substrate after film removal, thereby evaluating a stress in the film.
[2] The method of [1] wherein the film to be inspected is at least one film selected from a phase shift film, light-shielding film, etching mask film, and etching stop film.
[3] The method of [1] or [2] wherein the photomask blank or intermediate thereof is manufactured by a process comprising the step of imparting energy to the film of the photomask blank or intermediate thereof.
[4] The method of any one of [1] to [3] wherein another film is deposited on the photomask blank or intermediate thereof before the photomask blank or intermediate thereof is processed into a photomask, the deposition of the other film on the film to be inspected imparting energy to the film to be inspected,
  the method comprising
  the step of previously imparting to the film to be inspected an amount of energy corresponding to said energy imparted by deposition of the other film, prior to step (A),
  steps (A) to (C) of measuring the surface topographies, and
  step (D) of comparing the surface topographies, thereby evaluating a stress in the film.
[5] The method of [4] wherein the other film is a photoresist film.
[6] The method of any one of [1] to [5] wherein the stress in the film to be inspected is evaluated by
  (1) measuring each of the outermost surface of the photomask blank or intermediate prior to removal of the film to be inspected and the outermost surface of the treated substrate after removal of the film, by a surface topography measuring device, obtaining XYZ three-dimensional coordinate data of each outermost surface,
  (2) computing a least square plane of each outermost surface from the coordinate data of each outermost surface,
  (3) while the relative position between the coordinates of the outermost surface of the photomask blank or intermediate and the least square plane thereof, and the relative position between the coordinates of the outermost surface of the treated substrate and the least square plane thereof are fixed, arranging the coordinates and the least square plane such that
    (i) two least square planes are positioned on XY plane of a XYZ three-dimensional imaginary space,
    (ii) both the center of an outermost equivalent region of the photomask blank or intermediate providing the former least square plane and the center of an outermost equivalent region of the treated substrate providing the latter least square plane are positioned at the origin, and
    (iii) the two outermost equivalent regions are arranged in overlay with their diagonal directions in alignment so that the four corners of the two outermost equivalent regions correspond to each other, respectively, before and after removal of the film to be inspected.
  (4) within the range of the coordinate data arranged as above, for each pair of coordinates between the coordinates of the outermost surface of the photomask blank or intermediate and the coordinates of the outermost surface of the treated substrate that are coincident in X and Y values, computing the difference ($Z_1-Z_2$) between a Z value ($Z_1$) of the outermost surface of the photomask blank or intermediate and a Z value ($Z_2$) of the outermost surface of the treated substrate, and
  (5) determining a sum of the magnitude of maximum and the magnitude of minimum of the difference ($Z_1-Z_2$) of Z values that represents a warpage change,
  wherein the surface topographies are compared in terms of the warpage change for evaluation.

[7] A method for judging a photomask blank or intermediate thereof on a pass/fail basis, the method comprising the steps of determining a warpage change by the inspection method of

[6] and judging the photomask blank or intermediate thereof on a pass/fail basis in terms of the warpage change.

[8] The method of [7] wherein the photomask blank or intermediate thereof is judged pass when the warpage change is up to 50 (nm)/L/152 (mm) wherein L is the length (in mm) of a longer side of a transparent substrate.

Advantageous Effects of Invention

Utilizing the results of the method for inspecting and judging a photomask blank or intermediate according to the invention, the process for the manufacture of a photomask blank may be optimized so that a photomask blank having a minimal possibility of undergoing a change of surface topography before and after etching of an optical functional film or a process functional film may be manufactured. The photomask blank thus produced guarantees the minimized occurrence of a dimensional error by a change of surface topography during processing into a photomask.

DESCRIPTION OF EMBODIMENTS

Figure 1A:
FIG. 1 illustrates, for a photomask blank or intermediate having deposited on a substrate a film to be inspected and the treated substrate after removal of the film to be inspected, how to evaluate a change of surface topography before and after removal of the film to be inspected.

Photomasks for use in the photolithography for printing a pattern size of up to 65 nm, especially up to 45 nm, especially photomasks for use in the double patterning version of photolithography are required to have a very high mask accuracy. Accordingly, the processing of photomask blanks is also required to have a very high processing accuracy.

It is described in JP-A 2003-50458 that as to the photomask used in microprocessing, there was already a need for a transparent substrate having a specific shape which does not undergo a shape change when the photomask is chucked and mounted in an exposure tool. Once a low stressed optical film is deposited on such a photomask-forming transparent substrate having a specific shape to construct a photomask blank, the optical film is etched to fabricate a photomask, ensuring the production yield of photomasks. In the field of light-shielding film and phase shift film, a light-shielding film which gives a surface topography closely conformal to the surface topography of a substrate prior to film deposition has been sought for as the low-stressed light-shielding film.

For example, when a halftone phase shift mask blank is manufactured by depositing a film containing molybdenum, silicon, oxygen and nitrogen on a photomask-forming transparent substrate, the resulting photomask blank has a relatively high compression stress. By irradiating the photomask blank from a flash lamp so that the shape of the blank may be adjusted to resume the shape of the original transparent substrate, a photomask blank having a halftone phase shift film which is regarded substantially stress-free on the basis of the prior art standard is manufactured as described in JP-A 2004-199035. The inventors found that if the halftone phase shift film is removed from the blank by dry etching, the surface topography is changed although the surface topography of the substrate used during film deposition and the surface topography of the photomask blank after irradiation from a flash lamp are conformal to each other. That is, the treated substrate provides a surface topography different from the surface topography of the substrate used during film deposition.

If such a deformation of the surface topography or a change of warpage (sori) is induced by processing a film of a photomask blank, an error in the pattern position is introduced during the fabrication of a photomask from the photomask blank.

Reference is made to processing of a light-shielding film. In pattern processing, a resist pattern for protecting the region where a light-shielding film pattern is to be left is first formed by patternwise irradiation of electron beam, for example. Then, using the resulting resist pattern, the unnecessary portion of light-shielding film is removed by etching. Particularly in the case of a mask having a bright pattern (i.e., pattern with a less area of remaining light-shielding film), a more fraction of light-shielding film is removed. If the light-shielding film has a substantial stress, then a drastic change of the surface topography occurs. If such a change of the surface topography occurs, the position where the resist is formed and the position of the light-shielding film pattern are identical when viewed on the basis coordinates along the substrate surface. But, assuming a coordinate system wherein three-dimensional absolute coordinates are set in a space, for example, wherein coordinates are set so that the center point of the photomask blank surface is the origin, and a least square surface of the photomask blank surface is X-Y plane, if a change of warpage (sori) occurs, then point A on the photomask blank surface with coordinates ($a_x$, $a_y$, $a_z$) wherein $a_x=a_y\neq 0$ is displaced not only in Z axis direction, but also in X and/or Y axis direction.

In the case of a photomask to be used in the nearly commercially available photolithography for forming a resist pattern having a pattern rule of up to 50 nm, for example, a typical photomask of 152 mm square, if the position at the stage of photomask completion is shifted from the designed position, i.e., the position of EB irradiation by 50 nm in Z axis direction of the three-dimensional coordinate system, then the photomask is no longer regarded as reliable.

One embodiment of the invention provides a method for inspecting a photomask blank or an intermediate thereof having a film on a substrate by evaluating a stress in the film. The method comprises the steps of:

(A) measuring a surface topography of a photomask blank or intermediate having a film whose stress is to be determined, (B) removing the film from the photomask blank or intermediate to provide a treated substrate, (C) measuring a surface topography of the treated substrate after removal of the film, and (D) comparing the surface topography of the photomask blank or intermediate prior to film removal with the surface topography of the treated substrate after film removal, thereby evaluating a stress in the film.

To ensure that photomask blanks are reliable, the invention takes the following procedure rather than confirming that the shape of a photomask blank has not changed from the shape of the substrate prior to film deposition. After the photomask blank or intermediate is completed by film deposition, inspection is carried out by selecting one or more films to be inspected from optical functional films such as a light-shielding film and phase shift film (typically, halftone phase shift film) and process functional films such as an etching mask film and etching stop film, removing the selected film by etching, and confirming that the surface topography does not change before and after the film removal. Then the photomask blank is guaranteed to comply with a high accuracy of processing that is currently desired in the industry.

Prior to the description of the inspection method, a film to be inspected, that is, a film to be removed, and a photomask blank and intermediate thereof having the film are described. Where a photomask blank has two or more films, the films are successively deposited on a substrate to manufacture the photomask blank. The films include optical functional films such as a phase shift film and a light-shielding film and process functional films such as an etching mask film and etching stop film. The intermediate is an intermediate product obtained whenever one of the films is deposited. In the practice of the invention, an intermediate having a single film deposited on a substrate is typically used as an object to be inspected because it is a film quality testing substrate that enables to evaluate the quality of an individual film.

One example is a photomask blank having only a light-shielding film. This photomask blank may be of one type including a layer having an antireflective function as an upper layer and a layer having a light-shielding function as a lower layer or of another type including a layer having a light-shielding function sandwiched between layers having an anti-reflective function. For inspection of the photomask blank, the surface topography prior to removal of the light-shielding film and the surface topography after removal of the light-shielding film (that is, the surface topography of transparent substrate) are compared. If the inspection demonstrates no substantial change of surface topography in this photomask blank, it ensures that no shape change will occur when a photomask having a bright pattern is fabricated from the photomask blank.

Another example is a photomask blank having only a phase shift film, typically a halftone phase shift film. The film may consist of a single layer or multiple layers. Likewise, inspection is performed by removing the phase shift film. It may then be confirmed that no shape change will occur when a phase shift mask is fabricated from the photomask blank.

For a photomask blank having a phase shift film, typically a halftone phase shift film, and a light-shielding film deposited thereon, inspection may be performed by removing only the light-shielding film. It may then be confirmed that no shape change will occur when a phase shift mask having a dark pattern (i.e., pattern providing more a substantially light-shielded portion of the phase shift film) is fabricated from the photomask blank. If inspection is performed by removing both the light-shielding film and the phase shift film, it may then be confirmed that no shape change will occur when a phase shift mask having a bright pattern is fabricated from the photomask blank. In the photomask blank having a phase shift film and a light-shielding film, an etching stop film which is a process functional film may be disposed as an intermediate layer. In this case, only the etching stop film may be an object to be inspected. Usually, depending on whether or not the etching stop film adds to the phase shift quantity of the phase shift film, as judged from the optical design, it is determined whether the etching stop film is assigned to part of the phase shift film or part of the light-shielding film. Accordingly, it may be determined based on this criterion whether or not the etching stop film should also be removed when the light-shielding film or the phase shift film is removed. If the film is sufficiently thin to presume that no difference is induced in film stress whether or not the film is removed, the film may or may not be removed. In this example, if an optical functional film is disposed below the etching stop film (adjacent to the transparent substrate), inspection may be performed optionally by removing the optical functional film.

Further examples include a photomask blank having an etching mask film (process functional film) disposed on a light-shielding film (optical functional film), as described in JP-A 2007-241060; and a photomask blank having an etching mask film deposited on a halftone phase shift film (optical functional film) as described in JP-A H07-140635. Although the term "etching mask film" generally include both a film serving as a partial layer of optical functional film so that it is partially left in the photomask form and a film serving as a process assisting film during etching of the underlying film adjacent to the transparent substrate so that its entirety is finally removed, the term "etching mask film" as used herein refers to only the latter film which is finally removed in entirety. In these photomask blanks, inspection is performed by stripping only the etching mask film. It may then be confirmed that no shape change will occur from the film deposited below the etching mask film when a photomask having a dark pattern is fabricated. In these embodiments, inspection may be performed optionally by further removing the optical functional film disposed below the etching mask film.

Although a film does not cause deformation to a substrate during deposition, there occurs a phenomenon that when the film is removed from the completed photomask blank, the substrate after film removal is changed in shape. Although the cause of this phenomenon is not fully understood, it is speculated that the impartment of energy to the deposited film, for example, by irradiation of high-energy radiation or heating is one of such causes. After a film is deposited by sputtering, especially by reactive sputtering with reactive gas, it is typically heat treated, in order to stabilize the film quality. As described in JP-A 2004-199035, when a film having a substantial stress is heated by a conventional heating unit, it is difficult to completely relieve the stress from the film. However, the heat causes the surface topography to be changed to some extent, though short of stress relief. Even such a change can affect the reliability of a photomask for use in the lithography for forming a very fine feature pattern.

Therefore, the invention is effectively applicable to a photomask blank or intermediate having a film which is manufactured by a process including the step of imparting energy to the film of the photomask blank or intermediate.

For the above reason, better results are obtained when the film to be inspected is not a film as immediately deposited, but a film having a process history until the completion of a photomask blank, for example, a film having experienced the history of optional energy impartment to the film as by light irradiation or heating. When inspection in a more strict mode is desired, the step of heating during resist pattern formation in the processing of the photomask blank into a photomask should be taken into account as one factor of the potential process history.

Then, one example subject to inspection in a more strict mode is a photomask blank having a resist film (e.g., photoresist film) deposited as an additional film. The additional film is deposited on the film to be inspected, and the energy which will be imparted to the relevant film by imparting energy (such as by heating) in processing of the additional film is previously imparted to the relevant film, following which the surface topography of the photomask blank or intermediate having the relevant film is measured. Specifically, a photomask blank or intermediate having experienced the history of energy impartment such as by heating during resist pattern formation is an object to be inspected.

Since the heating step during resist pattern formation is conducted at a lower temperature for a shorter time than the heating step for film quality stabilization after sputter film deposition, its impact is regarded less significant. If the blank has been heated after sputter film deposition, the heating history may be omitted in a simplified version. On the other hand, if the heating step of imparting more heat than the heating during resist pattern formation, for example, heating after sputter film deposition is not involved in the manufacture process, the blank has a more possibility that the heating during resist pattern formation has an impact. It is then preferred that the history of heating during resist pattern formation is added to the blank before inspection is performed.

The heating in the resist pattern formation step generally includes heating prior to exposure and post-exposure heating. The treatment to add the heating history is preferably in accord with the resist pattern formation step. The heating step may be a single heating step or plural heating steps. The temperature range is the heating temperature actually used in the resist pattern formation step ±about 20° C. The heating time may be selected in the range from ⅓ of to 2 times the total of actual times involved in the resist pattern formation step. If the deformation impact that such heating has on the film to be inspected is previously known, the heating treatment may be simplified.

The inspection method of the invention is also applicable to a photomask blank intermediate, and a substrate having only a phase shift film, light-shielding film, etching mask film or etching stop film deposited thereon, that is, a film quality testing substrate for evaluating the quality of an individual film. That is, since the photomask blank is basically not separately used whether the pattern to be formed is bright or dark, an optical functional film or process functional film to constitute a photomask blank is basically preferred to independently cause no change to the surface topography during its processing. Then when the material and layer construction of a film and the treatment to change its stress are determined, better results are obtained by using the inspection method of the invention to examine whether or not the surface topography is changed after a film once deposited is removed, and determining the film deposition method in accordance with the inspection results, rather than film deposition by a method of depositing a film which does not change the surface topography of a substrate prior to film deposition. The inspection method of the invention makes it possible that a process history corresponding to a subsequent processing step is added to a film once deposited, after which the film is removed and inspection is performed.

A further example is a photomask blank having a plurality of films deposited. Even if each film is deposited under appropriate conditions for that film, the behavior of a stack of films when a process history step such as heating or patterning is applied thereto is not always exactly the same as the behavior of each film in single form when the process history step is applied thereto. For more accurate inspection, it is effective to perform inspection on a photomask blank in the final form, that is, having all the films deposited.

The photomask blank or intermediate to which the inspection method of the invention is advantageously applicable is one used in fabricating a photomask to be used in the photolithography commensurate with a pattern rule of up to 50 nm. Although the foregoing description refers to a light transmissive mask, the invention is also applicable to reflective masks including EUV lithography masks.

Photomask-forming substrates (photomask blank-forming substrates) used in the fabrication of transmissive photomasks may be rectangular, and specifically square. Use may be made of conventional well-known substrates which are transparent to exposure light, such as synthetic quartz substrates. The preferred substrate is a photomask-forming substrate having a specific shape that undergoes no deformation when the photomask is chucked to the exposure tool as reported in JP-A 2003-50458.

The above-described photomask blank has a light-shielding film and/or a phase shift film as the optical functional film on a photomask-forming substrate, and may further have an etching mask film and/or an etching stop film as the process functional film effective for improving the accuracy of pattern processing.

With respect to the construction of these films, if the blank has both a light-shielding film and a phase shift film, the phase shift film and the light-shielding film are sequentially deposited on the substrate in the described order.

The etching mask film is used in order to increase the accuracy of processing when the outermost layer (typically the light-shielding film as described above) of the optical functional film is etched. It is typically disposed on the outermost layer of the optical functional film.

The etching stop film which is used to prevent the underlying film from being damaged during etching of the overlying film. It is typically disposed between the substrate and the phase shift film and/or between the phase shift film and the light-shielding film. However, the etching stop film is rarely provided as an independent film. The film having such an etching stop function is generally provided as a layer of the phase shift film disposed adjacent to the substrate or a layer of the light-shielding film or a layer of the light-shielding film disposed adjacent to the phase shift film (e.g., JP-A 2007-241065). For this reason, the etching stop film may be handled as a part of the phase shift film or a part of the light-shielding film.

As to the phase shift film which is one of the optical function film, typically halftone phase shift film, a number of examples are known. In general, the phase shift film consists of a single layer, multiple layers, or a compositionally graded layer. The material of which the phase shift film is made is typically a transition metal-containing silicon material having a light element such as oxygen or nitrogen added thereto (e.g., JP-A H07-140635). A layer of a transition metal or a layer of a transition metal having a light element such as oxygen or nitrogen added thereto may be included as one constituent layer in the phase shift film.

The phase shift film is typically a film having a certain compression stress at the as-deposited-stage since substantial amounts of light elements are contained when the overall film is considered. If a phase shift film itself has a noticeable compression stress in the as-deposited-state, the inspection of the surface topography after removal of the phase shift film may display failure. Then, it may be sometimes necessary to provide stress relief. A number of stress relieving treatments are known as described in JP-A 2004-199035, and any of well-known treatments may be employed.

In the embodiment wherein the phase shift film is a halftone phase shift film, the halftone phase shift film may consist of a single layer, multiple layers, or a compositionally graded layer. The halftone phase shift film may be made of an optionally transition metal-containing silicon material. It is specifically a transition metal-silicon alloy or a transition metal silicon compound containing a transition metal, silicon, and at least one element selected from oxygen, nitrogen and carbon, preferably a transition metal silicon compound containing a transition metal, silicon, and oxygen and/or nitrogen. Examples of the transition metal silicon compound include a transition metal silicon oxide, transition metal silicon nitride, transition metal silicon oxynitride, transition metal silicon oxycarbide, transition metal silicon nitride carbide, and transition metal silicon oxide nitride carbide. The transition metal used herein is preferably at least one of titanium, vanadium, cobalt, nickel, zirconium, niobium, molybdenum, hafnium, tantalum and tungsten, with molybdenum being more preferred for ease of dry etching. The optionally transition metal-containing silicon material may preferably be composed of 10 atom % to 95 atom % of silicon, 0 atom % to 60 atom % of oxygen, 0 atom % to 57 atom % of nitrogen, 0 atom % to 20 atom % of carbon, and 0 atom % to 35 atom %, especially 1 atom % to 20 atom % of a transition metal. The material may be selected from the composition range, depending on the film construction (single layer or multiple layers) and film thickness, so as to provide the desired transmittance and phase shift.

From the photomask blank or intermediate completed, the phase shift film is removed to allow for inspection of a warpage change. This removal may be achieved by a technique similar to the etching technique used in etching of the phase shift film for processing into a photomask. For the optionally transition metal-containing silicon material, dry etching with fluorine base etchant gas is preferably used.

The light-shielding film which is another example of the optical function film may be made of any well-known materials including chromium base materials and optionally transition metal-containing silicon materials, or a combination of such layers. In general, the light-shielding film is a multilayer film consisting of a light-shielding layer for substantially inhibiting light transmission and an antireflective layer for reducing reflectance, or a compositionally graded film. The antireflective layer is disposed only on the obverse side of the light-shielding film or both on the obverse side and the substrate side of the light-shielding film.

The light-shielding film includes the light-shielding layer which is free of light elements (oxygen, nitrogen, carbon, etc.) or has relatively low contents of light elements in order to substantially inhibit light transmission. Inversely, the antireflective layer has relatively high contents of light elements since a certain degree of light transmission is necessary. Therefore, the light-shielding layer tends to have a tensile stress whereas the antireflective layer tends to have a compression stress. To avoid the overall light-shielding film from becoming a film having a very high stress, the light-shielding film is designed so that the overall film may not have a substantial stress. This is achievable by stress relieving treatment or balancing the stress between the light-shielding layer and the antireflective layer.

The material of which the light-shielding film is made may be a chromium base material, specifically chromium alone or a chromium compound containing chromium and at least one element of oxygen, nitrogen and carbon. The chromium base material preferably has a composition containing 30 atom % to 100 atom % of chromium, 0 atom % to 60 atom % of oxygen, 0 atom % to 50 atom % of nitrogen, and 0 atom % to 20 atom % of carbon. As described above, a tensile stress is induced at a high chromium content whereas a compression stress is induced at high contents of light elements such as oxygen, nitrogen and carbon. The composition of the film is preferably selected while taking into account this relationship.

The material of which the light-shielding film is made may also be an optionally transition metal-containing silicon material, specifically a transition metal-silicon alloy or a transition metal silicon compound containing a transition metal, silicon, and at least one element selected from oxygen, nitrogen and carbon, preferably a transition metal silicon compound containing a transition metal, silicon, and oxygen and/ or nitrogen. Examples of the transition metal silicon compound include a transition metal silicon oxide, transition metal silicon nitride, transition metal silicon oxynitride, transition metal silicon oxycarbide, transition metal silicon nitride carbide, and transition metal silicon oxide nitride carbide. The transition metal used herein is preferably at least one of titanium, vanadium, cobalt, nickel, zirconium, niobium, molybdenum, hafnium, tantalum and tungsten, with molybdenum being more preferred for ease of dry etching. The optionally transition metal-containing silicon material may preferably be composed of 10 atom % to 95 atom % of silicon, 0 atom % to 60 atom % of oxygen, 0 atom % to 57 atom % of nitrogen, 0 atom % to 20 atom % of carbon, and 0 atom % to 35 atom %, especially 1 atom % to 20 atom % of a transition metal. In general, a tensile stress is induced in the film at a high silicon content whereas a compression stress is induced at high contents of other elements. The composition of the film is preferably selected while taking into account this relationship.

The material may be selected from the composition range, depending on the film construction and film thickness, so that the light-shielding film alone (where a light-absorbing film like a halftone phase shift film is not included aside from the light-shielding film) or the light-shielding film combined with a light-absorbing film (if included) may have an extinction coefficient of at least 2.0, preferably at least 2.5 with respect to exposure light.

From the photomask blank or intermediate completed, the light-shielding film is removed to allow for inspection of a warpage change. Film removal may be achieved by a technique similar to the etching technique used in etching of the light-shielding film for processing into a photomask. Where a film of an optionally transition metal-containing silicon material is etched, dry etching with fluorine base etchant gas is generally used. If the relevant film is etchable with chlorine base etchant gas, chlorine dry etching may be used. Where a film is made of a chromium base material, dry etching with chlorine etchant gas having oxygen added thereto is preferably used.

The etching mask film which belongs to the process functional film functions, when a film (typically light-shielding film) deposited on the substrate side of the etching mask film is etched, as an etching mask for protecting a selected portion of the film from being etched, and is eventually stripped in entirety until the photomask is completed. The etching mask film is made of the material which has high resistance under etching conditions employed in etching of the protected film so that the film may function as an etching mask and which can be removed under conditions causing no damage to the protected film. Where the protected film is made of an optionally transition metal-containing silicon material, the etching mask film is preferably made of a chromium base material (see JP-A 2007-241060). Where the protected film is made of a chromium base material, the etching mask film is preferably made of an optionally transition metal-containing silicon material (see JP-A S63-85553).

Since the etching mask film may be made as thin as 1 nm to 5 nm depending on a choice of material, the stress in this film is out of concern in the prior art. For a higher accuracy of control, however, it is preferred to control the stress in the etching mask film. The control means may be, as in the case of the light-shielding film, stress relieving treatment or a combination of a light element-rich layer with a light element-short layer, both selected from the materials used in the etching mask film. For stripping of the etching mask film, as in the case of the light-shielding film, an appropriate technique may be selected in accordance with a particular material used.

On the other hand, the etching stop film may be handled as a part of the phase shift film or a part of the light-shielding film as described above. The material of which the etching stop film is made is preferably selected from the same materials as exemplified for the phase shift film and the light-shielding film. An appropriate etching technique may be used for a particular film.

As described above, in the photomask blank having an optical functional film and a process functional film, it is preferred to independently control the stresses of the respective films. Even when a film is designed and deposited so that no substantial stress may be induced in the film upon deposition, the surface may sometimes be deformed upon removal of that film. Therefore, in selecting a combination of films which ensures that the shape change does not exceed the prescribed level when the films are removed from the photomask blank, films each not having a substantial stress are combined, and the behavior of surface topography change after having passed all the steps of the photomask fabrication process is evaluated. Then a proper combination is selected.

A comparison of the surface topography of the photomask blank or intermediate prior to removal of the film to be inspected with the surface topography of the photomask blank or intermediate after removal of the film to be inspected may be performed by the following procedure.

For example, using a surface analysis device or surface topography measuring device capable of optically scanning a topography of a surface (a surface of transparent substrate, a surface of a film deposited (i.e., a surface of photomask blank or intermediate), or a surface of a treated transparent substrate or film treated after removal of the film to be inspected), a surface topography of the photomask blank or intermediate prior to removal of the film to be inspected is measured to deliver data of measurement. Next, the film to be inspected is removed, and a surface topography after film removal is measured to deliver data of measurement. The difference between these two surface topographies may generally be evaluated as a warpage change. The warpage change may be determined by any method which can rationally define a quantity of warpage change. The reference value below which a blank is judged pass (acceptable) may be set in accordance with the desired mask accuracy. For example, the photomask blank or intermediate may be judged on a pass/fail basis by comparing the surface topographies in the following way.

Subject to analysis are the outermost surface of a photomask blank or intermediate prior to removal of the film to be inspected and the outermost surface of a treated substrate after removal of all the films to be inspected from the photomask blank or intermediate.

(1) The outermost surfaces are measured by the surface topography measuring device, obtaining XYZ three-dimensional coordinate data of each outermost surface.
(2) From the coordinate data of each outermost surface, a least square plane of that outermost surface is computed.
(3) While the relative position between the coordinates of the outermost surface of the photomask blank or intermediate and the least square plane thereof, and the relative position between the coordinates of the outermost surface of the treated substrate and the least square plane thereof are fixed, the coordinates and the least square plane are arranged such that (i) two least square planes are positioned on XY plane of a XYZ three-dimensional imaginary space, (ii) both the center of an outermost equivalent region of the photomask blank or intermediate providing the former least square plane and the center of an outermost equivalent region of the treated substrate providing the latter least square plane are positioned at the origin, and (iii) the two outermost equivalent regions are arranged in overlay with their diagonal directions in alignment so that the four corners of the two outermost equivalent regions correspond to each other, respectively, before and after removal of the film to be inspected.
(4) Within the range of the coordinate data arranged as above, for each pair of coordinates between the coordinates of the outermost surface of the photomask blank or intermediate and the coordinates of the outermost surface of the treated substrate that are commensurate in X and Y values, the difference $(Z_1-Z_2)$ between a Z value $(Z_1)$ of the outermost surface of the photomask blank or intermediate and a Z value $(Z_2)$ of the outermost surface of the treated substrate is computed.
(5) A sum of the magnitude of maximum and the magnitude of minimum of the difference $(Z_1-Z_2)$ of Z values is determined, that represents a warpage change.

More specifically, the surface topography of the outermost surface of the photomask blank or intermediate prior to removal of the film to be inspected (i.e., the surface of the film to be inspected) is measured by a surface topography measuring device using an optical system. The device delivers XYZ three-dimensional coordinate data of the outermost surface to create a surface map, from which a least square plane is computed. Next, all the films to be inspected are removed typically under the stripping conditions used in their processing. The surface topography of the outermost surface of the treated substrate after removal of the film to be inspected (i.e., the surface of a film disposed contiguous to the film to be inspected, if any, or transparent substrate) is similarly measured. The device delivers XYZ three-dimensional coordinate data of that outermost surface to create a surface map, from which a least square plane is computed.

Next, using a suitable unit, typically a computer, the coordinates and the least square planes thus obtained are arranged in an imaginary space so as to meet all the following conditions (i) to (iii), while the relative position between the coordinates of the outermost surface of the photomask blank or intermediate and the least square plane thereof, and the relative position between the coordinates of the outermost surface of the treated substrate and the least square plane thereof are fixed (i.e., the coordinates of the outermost surface and the least square plane providing them are integrated).
(i) Two least square planes are positioned on XY plane of a XYZ three-dimensional imaginary space.
(ii) Both the center of an outermost equivalent region of the photomask blank or intermediate providing the former least square plane and the center of an outermost equivalent region of the treated substrate providing the latter least square plane are positioned at the origin.
(iii) The two outermost equivalent regions are arranged in overlay with their diagonal directions in alignment so that the four corners of the two outermost equivalent regions correspond to each other, respectively, before and after removal of the film to be inspected.

Figure 1B:
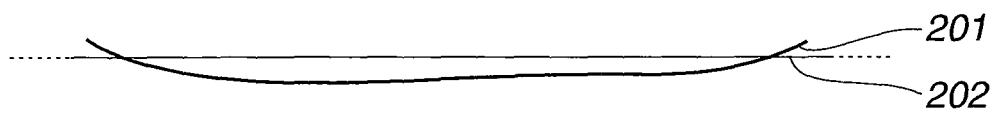
Figure 1C:
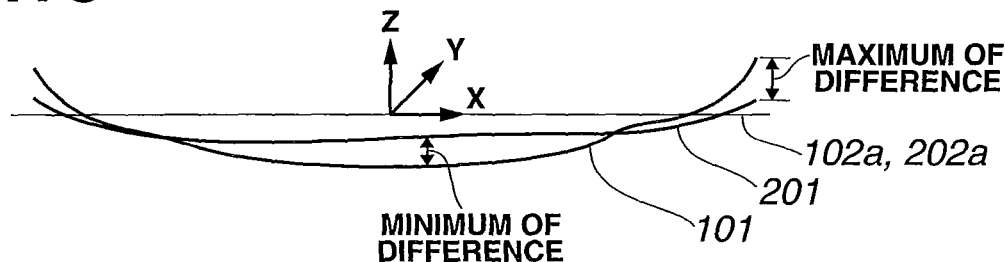

The foregoing procedure is described with reference to FIG. 1. A coordinate group 101 of the outermost surface of a photomask blank or intermediate and a least square plane 102 thereof as shown in FIG. 1A, and a coordinate group 201 of the outermost surface of a treated substrate and a least square plane 202 thereof as shown in FIG. 1B are arranged in a XYZ three-dimensional imaginary space as shown in FIG. 1C. The least square planes 102 and 202 are arranged on XY plane, so that both the planes are positioned in a common plane. Both an outermost equivalent region 102a of the photomask blank or intermediate providing least square plane 102 and an outermost equivalent region 202a of the treated substrate providing the least square plane 202 are arranged such that their centers are positioned at the origin of XYZ coordinates. That is, least square planes 102 and 202 are arranged in XY plane with Z=0. Further the two outermost equivalent regions are arranged with their diagonal directions in alignment so that four corners of the outermost equivalent region 102a correspond to four corners of the outermost equivalent region 202a, respectively, (one corner corresponds to relevant one corner) before and after removal of the film to be inspected.

Next, as shown in FIG. 1C, within the range of the coordinate data arranged as above, for each pair of coordinates between the coordinates of the outermost surface of the photomask blank or intermediate and the coordinates of the outermost surface of the treated substrate that are commensurate in X and Y values, the difference ($Z_1-Z_2$) between a Z value ($Z_1$) of the outermost surface of the photomask blank or intermediate and a Z value ($Z_2$) of the outermost surface of the treated substrate is computed. The value of difference ($Z_1-Z_2$) is positive (+) if $Z_1 > Z_2$, and negative (−) if $Z_1 < Z_2$.

A sum of the magnitude (absolute value) of maximum and the magnitude of minimum of the difference ($Z_1-Z_2$) of Z values represents a warpage change.

For a photomask blank or intermediate of 152 mm (6 inches) square, a warpage change of up to 50 nm indicates a processing accuracy with a latitude enough to be used in the double patterning version of lithography to form a pattern with a minimum line width of about 25 nm.

For photomask blanks or intermediates of different dimensions, a permissible warpage change is in proportion to the dimensions. As long as the warpage change is up to 50 nm/L/152 mm wherein L is the length (in mm) of a longer side of a transparent substrate, a high processing accuracy is available.

Briefly stated, coordinate data are applicable to both the outermost surface of a photomask blank and the outermost surface of a treated substrate, from which a least square plane of the surface may be computed in a simplified way. Three or more points are set on a circle having a radius R (mm) about the center of each outermost surface. Least square planes are computed from the coordinates of the three or more points and the centers. Thereafter, a warpage change may be similarly evaluated. For a photomask blank which is processed into a photomask for use in the double patterning version of lithography to form a pattern with a minimum line width of about 25 nm, the photomask blank is judged pass (acceptable) when the standard warpage change is cleared. If the value of warpage change is less than or equal to:

$$50 \text{ (nm)}/2R/(152 \text{ (mm)})\times\sqrt{2}$$

then the photomask blank is reliable enough to insure a photomask having a high positional accuracy.

When a photomask blank is manufactured by a particular process as having an optical functional film or process functional film and then processed into a photomask, a dimensional error will be introduced due to the stress of the optical functional film or process functional film. With the inventive method, this dimensional error may be estimated. If a sample under inspection is judged pass (acceptable), the inspection guarantees that photomask blanks manufactured by the same particular process as is the sample are free of any dimensional error due to surface deformation by processing. The invention substantially avoids formation of defective blanks due to dimensional errors as compared with prior art photomask blanks.

EXAMPLE

Examples of the invention are given below by way of illustration and not by way of limitation.

Example 1

Preparation of Photomask Blank Having Halftone Phase Shift Film

Four synthetic quartz photomask substrates of 152 mm square were prepared. By a sputtering technique using MoSi and Si targets and a mixture of nitrogen, oxygen and argon gases as the sputtering gas, a halftone phase shift film of MoSiON (Mo:Si:O:N=1:4:1:4 atomic ratio) having a thickness of 76 nm was deposited on each substrate.

Shape Adjustment

Using a xenon flash lamp having a pulse length of $1^{-10}$ msec, the four photomask blanks having the MoSiON film deposited thereon were irradiated in four different energy dosages. The energy dosage is expressed by a standardized value, provided that the energy dosage produced upon application of 3175 volts is unity (1).

Comparison of Surface Topography of Substrate Prior to Phase Shift Film Deposition with Surface Topography of Photomask Blank Having High Energy Imparted for Shape Adjustment The surface topography of the substrate prior to phase shift film deposition and the surface topography of the photomask blank having high energy imparted for shape adjustment were compared in terms of a warpage change ($\Delta$TIR). Warpage (sori) change, $\Delta$TIR (delta total indicator reading), is determined as follows.

Figure 2:
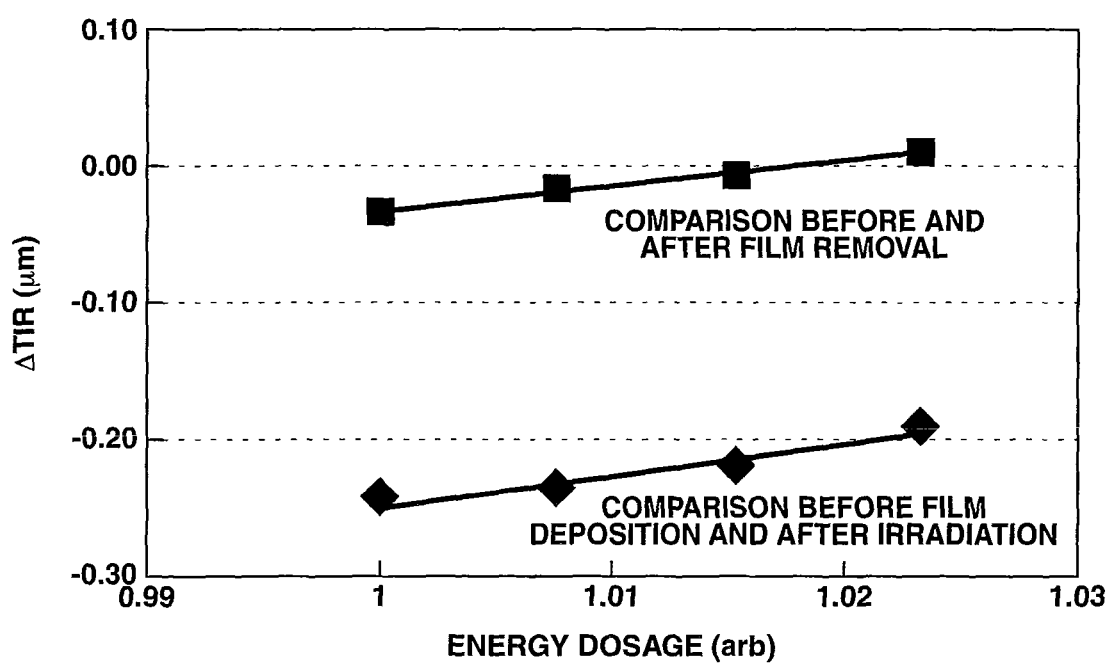
FIG. 2 is a diagram plotting warpage changes ($\Delta$TIR) in Example 1.

A surface topography of each photomask blank which underwent flash lamp irradiation after deposition of a halftone phase shift film was measured by an optical surface topography analyzing system Tropel UltraFlat® (Corning Tropel Corp.), obtaining surface topography data (coordinates). The data were compared with the data of previous measurement of the surface topography of the corresponding substrate prior to deposition of a halftone phase shift film in accordance with the steps (1) to (5), to compute a warpage change ($\Delta$TIR). It is assumed that a positive value of $\Delta$TIR is deformation by tensile stress. In FIG. 2, the warpage change ($\Delta$TIR) that the surface topography of each photomask blank after irradiation possesses relative to the surface topography of the corresponding substrate prior to deposition of a phase shift film is plotted versus the irradiation dose.

Removal of Phase Shift Film

From the photomask blanks having a phase shift film which had undergone shape adjustment by irradiation with a flash lamp in different energy dosages, the phase shift film was removed by dry etching with fluorine etchant gas.

RF1 (RIE): CW 54 V
RF2 (ICP): CW 325 W
Pressure: 5 mTorr
$SF_6$: 18 sccm
$O_2$: 45 sccm Comparison of Surface Topography of Photomask Blank (Having Undergone Shape Adjustment) Prior to Removal of Phase Shift Film with Surface Topography of Substrate after Removal A surface topography of the treated substrate after removal of the phase shift film by dry etching was measured by an optical surface topography analyzing system Tropel UltraFlat® (Corning Tropel Corp.), obtaining surface topography data. The data are similarly compared with the surface topography data of the photomask blank having undergone flash lamp irradiation after deposition of the halftone phase shift film, to compute a warpage change ($\Delta$TIR). This warpage change ($\Delta$TIR) versus the irradiation dosage is also plotted in FIG. 2.

It is presumed by extrapolation of plots in FIG. 2 that the substrate shape prior to deposition of a phase shift film is completely resumed by irradiation of high-energy radiation when an energy dosage of about 1.108 is irradiated. However, the value of ΔTIR resulting from removal of phase shift film after shape adjustment indicates, as seen from FIG. 2, that when an energy amount of about 1.108 is irradiated, a warpage change resulting from removal of phase shift film which is a simulative operation of processing into a bright pattern phase shift mask has a great positive value. The phase shift film irradiated in this energy amount is presumed to have a great tensile stress.

It is also seen from the plots in FIG. 2 that the value of ΔTIR after removal of phase shift film has a possibility of linear approximation to the irradiation amount of energy radiation. It is speculated that upon irradiation in an energy dosage of about 1.017, the stress of the film irradiated with a flash lamp becomes zero (0).

Example 2

Deposition of Etching Mask Film

By the same procedure as in Example 1, a halftone phase shift film of MoSiON (Mo:Si:O:N=1:4:1:4 atomic ratio) having a thickness of 76 nm was deposited on four synthetic quartz photomask substrates of 152 mm square. Using the flash lamp system in Example 1, the photomask blanks having the MoSiON film deposited thereon were irradiated in an energy amount of 1.015.

Using a DC sputtering system, an etching mask film of CrN having a thickness of 7 nm was deposited on the halftone phase shift film. A mixture of argon and nitrogen was fed as the sputtering gas so as to provide a gas pressure of 0.05 Pa in the chamber. A chromium target was sputtered while rotating the substrate at 30 rpm. The etching mask film was analyzed for composition by ESCA to find an atomic ratio Cr:N=9:1.

On the etching mask film of CrN, another etching mask film of CrON having a thickness of 7 nm was deposited. A mixture of argon and nitrogen was fed as the sputtering gas so as to provide a gas pressure of 0.05 Pa in the chamber. A chromium target was sputtered while rotating the substrate at 30 rpm. The etching mask film was analyzed for composition by ESCA to find an atomic ratio Cr:N:O=5.5:2:2.5.

Of four substrates having a halftone phase shift film and an etching mask film (of two layers) deposited thereon, two substrates were heat treated at 200° C. for 10 minutes (heat treatment A), and two substrates were heat treated at 150° C. for 10 minutes (heat treatment B), both for stabilizing the etching mask film. Halftone phase shift mask blanks having etching mask film were completed.

Of the photomask blanks treated under different heating conditions, each one was heated at 150° C. for 10 minutes (heat treatment C) as a simulation of the heating step in the resist film forming process.

The stress of the film in these four photomask blanks was inspected as follows. First, a surface topography of each photomask blank having an etching mask film is measured by an optical surface topography analyzing system Tropel UltraFlat® (Corning Tropel Corp.), obtaining surface topography data. Then chlorine dry etching was effected on the photomask blank under conditions: $Cl_2$ 185 sccm, $O_2$ 55 sccm, and He 9.25 sccm whereby only the etching mask film was selectively removed.

In accordance with the procedure of Example 1, the surface topography of the photomask blank prior to removal of the etching mask film was compared with the surface topography of the treated substrate after removal of the etching mask film (herein, treated substrate still having halftone phase shift film). For one photomask blank which belonged to the two photomask blanks heated at 200° C. for 10 minutes (heat treatment A) as film stabilizing step and which was not further heated at 150° C. for 10 minutes (heat treatment C), the stress involved in the etching mask film was compressive stress and a warpage change (ΔTIR) by film removal was 29 nm. For the other photomask blank which was further heated at 150° C. for 10 minutes (heat treatment C), the stress involved in the etching mask film was compressive stress and a warpage change (ΔTIR) by film removal was 28 nm.

On the other hand, for one photomask blank which belonged to the two photomask blanks heated at 150° C. for 10 minutes (heat treatment B) as film stabilizing step and which was not further heated at 150° C. for 10 minutes (heat treatment C), the stress involved in the etching mask film was compressive stress and a warpage change (ΔTIR) by film removal was 38 nm. For the other photomask blank which was further heated at 150° C. for 10 minutes (heat treatment C), the stress involved in the etching mask film was compressive stress and a warpage change (ΔTIR) by film removal was 29 nm.

It is evident from these results that the set of heat stabilizing conditions of an etching mask film including 200° C. and 10 minutes (heat treatment A) is effective in reducing a change of surface topography during deposition of photoresist film and acquiring processing reliability.

From two photomask blanks heated at 200° C. for 10 minutes (heat treatment A) which were inspected as above, the etching mask film was removed in accordance with the procedure of Example 1. Further, the halftone phase shift film was removed therefrom. The surface topography was compared before and after removal of the halftone phase shift film. For two blanks, the stress involved in the halftone phase shift film was compressive stress and a surface warpage change (ΔTIR) by film removal was 1 nm. Accordingly, for a photomask blank having an etching mask film and a halftone phase shift film, when both the etching mask film and the halftone phase shift film are removed, surface warpage changes (ΔTIR) by film removal are 30 nm and 29 nm. It is demonstrated that a high position accuracy is available when a bright pattern halftone phase shift mask is manufactured from this photomask blank.

Although the above Examples refer to a halftone phase shift film and an etching mask film, any optical functional films (other than halftone phase shift film) such as a light-shielding film and any process functional films such as an etching stop film may be evaluated for film stress by similar inspection.

Japanese Patent Application No. 2009-086173 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for inspecting a photomask blank or an intermediate thereof having a film on a substrate to be inspected for stress, comprising the steps of:
   (A) measuring a surface topography of a photomask blank or intermediate having a film to be inspected for stress,
   (B) removing all the film to be inspected from the photomask blank or intermediate to provide a treated substrate, (C) measuring a surface topography of the treated substrate after removal of the film, and
(D) comparing the surface topography of the photomask blank or intermediate prior to said film removal with the surface topography of the treated substrate after said film removal, thereby evaluating a stress in the film, wherein the stress in the film to be inspected is evaluated by
(1) measuring each of the outermost surface of the photomask blank or intermediate prior to removal of the film to be inspected and the outermost surface of the treated substrate after removal of the film, by a surface topography measuring device, obtaining XYZ three-dimensional coordinate data of each outermost surface,
(2) computing a least square plane of each outermost surface from the coordinate data of each outermost surface,
(3) while the relative position between the coordinates of the outermost surface of the photomask blank or intermediate and the least square plane thereof, and the relative position between the coordinates of the outermost surface of the treated substrate and the least square plane thereof are fixed, arranging the coordinates and the least square plane such that
  (i) two least square planes are positioned on XY plane of a XYZ three-dimensional imaginary space,
  (ii) both the center of an outermost equivalent region of the photomask blank or intermediate providing the former least square plane and the center of an outermost equivalent region of the treated substrate providing the latter least square plane are positioned at the origin, and
  (iii) the two outermost equivalent regions are arranged in overlay with their diagonal directions in alignment so that the four corners of the two outermost equivalent regions correspond to each other, respectively, before and after removal of the film to be inspected,
(4) within the range of the coordinate data arranged as above, for each pair of coordinates between the coordinates of the outermost surface of the photomask blank or intermediate and the coordinates of the outermost surface of the treated substrate that are coincident in X and Y values, computing the difference ($Z_1$-$Z_2$) between a Z value ($Z_1$) of the outermost surface of the photomask blank or intermediate and a Z value ($Z_2$) of the outermost surface of the treated substrate, and
(5) determining a sum of the magnitude of maximum and the magnitude of minimum of the difference ($Z_1$-$Z_2$) of Z values that represents a warpage change,
wherein the surface topographies are compared in terms of the warpage change for evaluation.

2. The method of claim 1 wherein the film to be inspected is at least one film selected from a phase shift film, light-shielding film, etching mask film, and etching stop film.

3. The method of claim 1 wherein the photomask blank or intermediate thereof is manufactured by a process comprising the step of imparting energy to the film of the photomask blank or intermediate thereof.

4. The method of claim 1 wherein the method being for photomasks in which another film is to be deposited on said film to be inspected before the photomask blank or intermediate thereof is processed into a photomask, the deposition of the other film on the film to be inspected imparting energy to the film to be inspected, and
the method comprising:
the step of previously imparting to the film to be inspected, by energy radiation, an amount of energy corresponding to said energy imparted by deposition of the other film, prior to step (A).

5. The method of claim 4 wherein the other film is a photoresist film.

6. The method of claim 4 wherein said energy radiation is light irradiation or heating.

7. A method for judging a photomask blank or intermediate thereof on a pass/fail basis, the method comprising the steps of determining a warpage change by the inspection method of claim 1 and judging the photomask blank or intermediate thereof on a pass/fail basis in terms of the warpage change.

8. The method of claim 7 wherein the photomask blank or intermediate thereof is judged pass when the warpage change is up to 50 (nm)/L/152 (mm) wherein L is the length (in mm) of a longer side of a transparent substrate.

9. A method for inspecting a photomask blank or an intermediate thereof having a film on a substrate to be inspected for stress, the method being for photomasks in which another film is to be deposited on said film to be inspected before the photomask blank or intermediate thereof is processed into a photomask, the deposition of the other film on the film to be inspected imparting energy to the film to be inspected, comprising the steps of:
(P) imparting to a film to be inspected, by energy radiation, an amount of energy corresponding to said energy imparted by deposition of the other film,
(A) measuring a surface topography of a photomask blank or intermediate having the film to be inspected for stress,
(B) removing the film to be inspected from the photomask blank or intermediate to provide a treated substrate,
(C) measuring a surface topography of the treated substrate after removal of the film, and
(D) comparing the surface topography of the photomask blank or intermediate prior to said film removal with the surface topography of the treated substrate after said film removal, thereby evaluating a stress in the film, wherein the stress in the film to be inspected is evaluated by
(1) measuring each of the outermost surface of the photomask blank or intermediate prior to removal of the film to be inspected and the outermost surface of the treated substrate after removal of the film, by a surface topography measuring device, obtaining XYZ threedimensional coordinate data of each outermost surface,
(2) computing a least square plane of each outermost surface from the coordinate data of each outermost surface,
(3) while the relative position between the coordinates of the outermost surface of the photomask blank or intermediate and the least square plane thereof, and the relative position between the coordinates of the outermost surface of the treated substrate and the least square plane thereof are fixed, arranging the coordinates and the least square plane such that
  (i) two least square planes are positioned on XY plane of a XYZ three-dimensional imaginary space,
  (ii) both the center of an outermost equivalent region of the photomask blank or intermediate providing the former least square plane and the center of an outermost equivalent region of the treated substrate providing the latter least square plane are positioned at the origin, and
  (iii) the two outermost equivalent regions are arranged in overlay with their diagonal directions in alignment so that the four corners of the two outermost equivalent regions correspond to each other, respectively, before and after removal of the film to be inspected,
(4) within the range of the coordinate data arranged as above, for each pair of coordinates between the coordinates of the outermost surface of the photomask blank or intermediate and the coordinates of the outermost surface of the treated substrate that are coincident in X and Y values, computing the difference ($Z_1-Z_2$) between a Z value ($Z_1$) of the outermost surface of the photomask blank or intermediate and a Z value ($Z_2$) of the outermost surface of the treated substrate, and (5) determining a sum of the magnitude of maximum and the magnitude of minimum of the difference ($Z_1-Z_2$) of Z values that represents a warpage change, wherein the surface topographies are compared in terms of the warpage change for evaluation.

10. The method of claim 9 wherein the film to be inspected is at least one film selected from a phase shift film, light-shielding film, etching mask film, and etching stop film.

11. The method of claim 9 wherein the other film is a photoresist film.

12. A method for judging a photomask blank or intermediate thereof on a pass/fail basis, the method comprising the steps of determining a warpage change by the inspection method of claim 9 and judging the photomask blank or intermediate thereof on a pass/fail basis in terms of the warpage change.

13. The method of claim 12 wherein the photomask blank or intermediate thereof is judged pass when the warpage change is up to 50 (nm)/L/152 (mm) wherein L is the length (in mm) of a longer side of a transparent substrate.

14. The method of claim 9 wherein said energy radiation is light irradiation or heating.

\* \* \* \* \*